United States Patent
Anantha et al.

(10) Patent No.: US 10,620,134 B2
(45) Date of Patent: Apr. 14, 2020

(54) CREATING DEFECT SAMPLES FOR ARRAY REGIONS

(71) Applicant: KLA-Tencor Corporation, Milpitas, CA (US)

(72) Inventors: Vidyasagar Anantha, Fremont, CA (US); Manikandan Mariyappan, Portland, OR (US); Raghav Babulnath, San Jose, CA (US); Gangadharan Sivaraman, Chennai (IN); Satya Kurada, Fremont, CA (US); Thirupurasundari Jayaraman, Chennai (IN); Prasanti Uppaluri, Saratoga, CA (US); Srikanth Kandukuri, Hyderabad (IN)

(73) Assignee: KLA-Tencor Corp., Milpitas, CA (US)

( * ) Notice: Subject to any disclaimer, the term of this patent is extended or adjusted under 35 U.S.C. 154(b) by 88 days.

(21) Appl. No.: 16/046,986

(22) Filed: Jul. 26, 2018

(65) Prior Publication Data
US 2019/0346375 A1    Nov. 14, 2019

(30) Foreign Application Priority Data

May 11, 2018 (IN) .............................. 2018/41017821
Jun. 11, 2018 (IN) .............................. 2018/41021730

(51) Int. Cl.
*G01N 21/95* (2006.01)
*G01N 23/2251* (2018.01)
*G01N 21/88* (2006.01)

(52) U.S. Cl.
CPC ..... *G01N 21/9501* (2013.01); *G01N 21/8806* (2013.01); *G01N 23/2251* (2013.01)

(58) Field of Classification Search
CPC .................................................. G01N 21/9501
(Continued)

(56) References Cited

U.S. PATENT DOCUMENTS 5,991,699 A * 11/1999 Kulkarni ............... H01L 22/20
                                                    257/E21.525
7,570,796 B2    8/2009 Zafar et al.
(Continued)

FOREIGN PATENT DOCUMENTS

JP        2004-047939        2/2004

OTHER PUBLICATIONS

International Search Report and Written Opinion for PCT/US2019/029756 dated Aug. 16, 2019.

*Primary Examiner* — Tarifur R Chowdhury
*Assistant Examiner* — Omar H Nixon
(74) *Attorney, Agent, or Firm* — Ann Marie Mewherter

(57) ABSTRACT

Methods and systems for creating a sample of defects for a specimen are provided. One method includes detecting defects on a specimen based on output generated by a detector of an output acquisition subsystem. For the defects detected in an array region on the specimen, where the array region includes multiple array cell types, the method includes stacking information for the defects based on the multiple array cell types. The stacking includes overlaying design information for only a first of the multiple array cell types with the information for only the defects detected in the first of the multiple array cell types. In addition, the method includes selecting a portion of the detected defects based on results of the stacking thereby creating a sample of the detected defects.

21 Claims, 5 Drawing Sheets

(58) Field of Classification Search
USPC .................................................... 356/237.5
See application file for complete search history.

(56) References Cited

U.S. PATENT DOCUMENTS

| | | |
|---|---|---|
| 7,676,077 B2 | 3/2010 | Kulkarni et al. |
| 8,126,255 B2 | 2/2012 | Bhaskar et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |
| 9,810,643 B1 | 11/2017 | Shoham et al. |
| 2007/0156379 A1* | 7/2007 | Kulkarni ............. G06F 17/5045 703/14 |
| 2014/0133737 A1 | 5/2014 | Plihal et al. |
| 2015/0330912 A1 | 11/2015 | Gosain et al. |
| 2016/0028407 A1* | 1/2016 | Jeong .................... H03K 5/135 327/141 |
| 2016/0110857 A1 | 4/2016 | Plihal et al. |
| 2016/0291191 A1* | 10/2016 | Fukushima ........ G01R 33/3415 |
| 2017/0192828 A1* | 7/2017 | Kwong ................... G06F 9/546 |
| 2017/0193680 A1 | 7/2017 | Zhang et al. |
| 2017/0200265 A1 | 7/2017 | Bhaskar et al. |

\* cited by examiner

CREATING DEFECT SAMPLES FOR ARRAY REGIONS

BACKGROUND OF THE INVENTION

1. Field of the Invention

This invention generally relates to methods and systems for creating a sample of defects detected on a specimen.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers. Inspection processes have always been an important park of fabricating semiconductor devices such as integrated circuits. However, as the dimensions of semiconductor devices decrease, inspection processes become even more important to the successful manufacture of acceptable semiconductor devices. For instance, as the dimensions of semiconductor devices decrease, detection of defects of decreasing size has become necessary since even relatively small defects may cause unwanted aberrations in the semiconductor devices.

Once defects have been detected by inspection, additional information for the defects may be generated in one or more manners. For example, the defects may be re-visited by defect review in which a system having resolution capability greater than that used during inspection is used to generate images of the defects. Information about the defects generated using such images may then be used to determine a type (or classification) of the defects. For example, the defects may be classified as particle type defects, bridging type defects, scratch type defects, and the like.

Due to the number of defects that are detected in any given inspection and due to the time involved in defect review and generating additional information for defects by other means, not all of the defects that are detected in inspection are further processed in defect review. Instead, in nearly every case, a sample of defects is created by selecting only a portion of all of the detected defects. Only that sample of defects is then further processed. The results of the defect review or other processing can then be extrapolated back to the entire detected population of defects.

Many methods have been developed for creating samples of detected defects for other processes. Some examples of currently used methods include random sampling and diversity sampling. Random sampling is performed as the name implies—a portion of the detected defects are randomly selected and then combined to create a defect sample. Diversity sampling is performed based on one or more characteristics of the defects determined by inspection to thereby select the defects having the most diverse set of characteristics. Many more complex methods have also been created for defect sampling.

Since the further processing of the defect sample is used to determine characteristics of the entire detected population of defects, there must be the concern that the defect sample accurately represents the defect population as a whole. In addition, there is also the concern that the defect sample is appropriate for determining information about the detected defects that a user is interested in. For example, if the inspection is performed for different areas in dies on the wafer, but the user only wants additional information about the defects detected in only one of those areas, then a defect sample that includes defects detected in areas other than that one area would be unsatisfactory for that application (e.g., performing the additional processing on defects that a user is not interested in is wasteful).

Creating defect samples is also more difficult in certain areas that others. For example, it can be particularly difficult to generate a defect sample for an array region in a die formed on a wafer or other specimen. In one such example, a typical design has multiple instances of array regions and each of them include different types of array cells or bit cells. Currently used systems and methods do not use this array cell or bit cell location information for sampling. Instead, sampling from array region that is currently performed is manual and substantially tedious despite the availability of features such as iDO, which is commercially available from KLA-Tencor, Milpitas, Calif., and nuisance event filters. For currently performed sampling in array regions, the time involved for effective sampling may be anywhere between 3 to 5 hours since it could involve multiple iterations of sampling.

Accordingly, it would be advantageous to develop systems and/or methods for creating a sample of defects detected on a specimen that do not have one or more of the disadvantages described above.

SUMMARY OF THE INVENTION

The following description of various embodiments is not o be construed in any way as limiting the subject matter of the appended claims.

One embodiment relates to a system configured to create a sample of defects detected on a specimen. The system includes an output acquisition subsystem that includes at least an energy source and a detector. The energy source is configured to generate energy that is directed to a specimen. The detector is configured to detect energy from the specimen and to generate output responsive to the detected energy. The system also includes one or more computer subsystems configured for detecting defects on the specimen based on the output generated by the detector to thereby generate a set of detected defects. The one or more computer subsystems are also configured for, for the defects detected in an array region on the specimen, where the array region includes multiple array cell types, stacking information for the defects based on the multiple array cell types. The stacking includes overlaying design information for only a first of the multiple array cell types with the information for only the defects detected in the first of the multiple array cell types. The information for only the defects detected in the first of the multiple array cell types includes positions of the defects within the first of the multiple array cell types. In addition, the method includes selecting a portion of the detected defects based on results of the stacking thereby creating a sample of the detected defects and generating defect sample results based on the selected portion of the detected defects and the information for the selected portion of the detected defects. The system may be further configured as described herein.

Another embodiment relates to a computer-implemented method for creating a sample of defects detected on a specimen. The method includes steps for each of the functions of the one or more computer subsystems described above. The steps of the method are performed by one or more computer subsystems coupled to an output acquisition subsystem configured as described herein. The method may be performed as described further herein. In addition, the method may include any other step(s) of any other method(s) described herein. Furthermore, the method may be performed by any of the systems described herein.

An additional embodiment relates to a non-transitory computer-readable medium storing program instructions executable on a computer system for performing a computer-implemented method for creating a sample of defects detected on a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
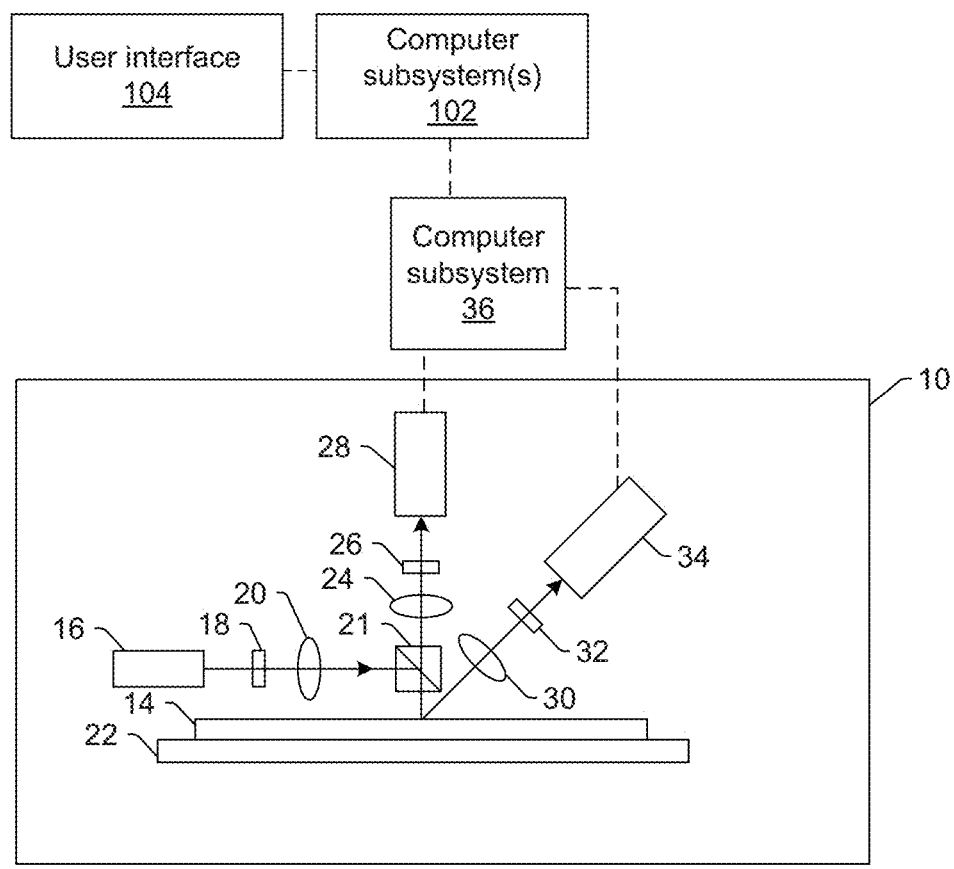
FIGS. 1 and 2 are schematic diagrams illustrating side views of embodiments of a system configured as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used interchangeably herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as reticle design file (KW) data, which is proprietary to KLA-Tencor, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In some instances, simulated or acquired images from a wafer or reticle can be used as a proxy for the design. Image analysis can also be used as a proxy for design analysis. For example, polygons in the design may be extracted from an image of a design printed on a wafer and/or reticle, assuming that the image of the wafer and/or reticle is acquired with sufficient resolution to adequately image the polygons of the design. In addition, the "design" and "design data" described herein refers to information and data that is generated by semiconductor device designers in a design process and is therefore available for use in the embodiments described herein well in advance of printing of the design on any physical wafers.

Preferably, the "design" or "physical design" as those terms are used herein refer to the design as it would be ideally formed on the wafer. In this manner, a design or physical design described herein would preferably not include features of the design that would not be printed on the wafer such as optical proximity correction (OPC) features, which are added to the design to enhance printing of the features on the wafer without actually being printed themselves. In this manner, in some embodiments, the design for the specimen used for the steps described further herein does not include features of the design that will not be printed on the specimen.

A "design" and "design data" described herein may therefore include data and information related to the physical intent for the device being formed on the wafer, which may include any of the various types of design and design data described above. A "design" and "design data" may also or alternatively include data and information related to the electrical intent for the device being formed on the wafer. Such information and data may include, for example, netlist and SPICE nomenclature and/or an "annotated layout" (e.g., where the design includes electrical netlist parameter labeling). Such data and information may be used to determine which parts of a layout or wafer image are critical in one or more electrical aspects.

Some advanced inspection tools (e.g., inspection tools that include broadband plasma (BBP) light sources that are commercially available from KLA-Tencor, Calif.) use chip design data or information for various use cases such as binning, care area accuracy, defect location improvements, nuisance filtering, and many more. Unlike currently used systems and methods, however, the embodiments described herein use the design intent to help improve sampling efficiency on array region defects. The concept can also be extended to logic areas if there are a sufficient number of repeating structures within logic areas of the chips.

Chip design data is available in the form of GDS and OASIS files from the lithography group/design group inside a foundry. This information is used to create the lithography mask that is used for printing various structures on the wafer. This information contains the blueprint of what gets printed on the wafer. The design data may also include any of the other design data described herein. Using this information, the embodiments described herein can help improve inspection sensitivity, reduce nuisance, and improve SEM sampling efficiency as described further herein. "Nuisance" as that term is used herein generally is defined as events that are detected as defects, but are not really defects that a user cares about. For example, nuisance may be caused by noise, defects otherwise erroneously detected as such, defects that are not defects of interest, and the like.

Design data describing the patterned features in the logic and array areas such as GDS or OASIS files are typically large, running into 10s of GB in size. Chip design data incorporates a lot of structure re-use, especially in array regions. As mentioned above, KLA-Tencor has a proprietary format called a reticle design file (RDF) representing chip design data. Today, the software is able to produce the full view of "design" information of a chip and on top of it, the defects detected in inspection can be overlaid. The results of the overlay helps a user to see defect distribution across the whole reticle/die.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to create a sample of defects detected on a specimen. In one embodiment, the specimen includes a wafer. In another embodiment, the specimen includes a reticle. The wafer and the reticle may include any wafer and reticle known in the art.

One embodiment of such a system is shown in FIG. 1. The system includes an output acquisition subsystem that includes at least an energy source and a detector. The energy source is configured to generate energy that is directed to a specimen. The detector is configured to detect energy from the specimen and to generate output responsive to the detected energy.

In one embodiment, the energy directed to the specimen includes light, and the energy detected from the specimen includes light. For example, in the embodiment of the system shown in FIG. 1, output acquisition subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to beam splitter 21, which directs the light to specimen 14 at a normal angle of incidence. The angle of incidence may include any suitable angle of incidence, which may vary depending on, for instance, characteristics of the specimen and the defects to be detected on the specimen.

The illumination subsystem may be configured to direct the light to the specimen at different angles of incidence at different times. For example, the output acquisition subsystem may be configured to alter one or more characteristics of one or more elements of the illumination subsystem such that the light can be directed to the specimen at an angle of incidence that is different than that shown in FIG. 1. In one such example, the output acquisition subsystem may be configured to move light source 16, optical element 18, and lens 20 such that the light is directed to the specimen at a different angle of incidence.

In some instances, the output acquisition subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing the light having different or the same characteristics to the specimen at different or the same angles of incidence sequentially or simultaneously.

In one embodiment, the energy directed to the specimen includes light generated by a broadband plasma (BBP) light source. For example, light source 16 may include a BBP light source. In this manner, the light generated by the light source and directed to the specimen may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for output acquisition.

The output acquisition subsystem may also include a scanning subsystem configured to cause the light to be scanned over the specimen. For example, the output acquisition subsystem may include stage 22 on which specimen 14 is disposed during output acquisition. The scanning subsystem may include any suitable mechanical and/or robotic assembly (that includes stage 22) that can be configured to move the specimen such that the light can be scanned over the specimen. In addition, or alternatively, the output acquisition subsystem may be configured such that one or more optical elements of the output acquisition subsystem perform some scanning of the light over the specimen. The light may be scanned over the specimen in any suitable fashion.

The output acquisition subsystem further includes one or more detection channels. At least one of the one or more detection channels includes a detector configured to detect light from the specimen due to illumination of the specimen by the output acquisition subsystem and to generate output responsive to the detected light. For example, the output acquisition subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 1 shows an embodiment of the output acquisition subsystem that includes two detection channels, the output acquisition subsystem may include a different number of detection channels (e.g., only one detection channel or two or more detection channels). Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTS), charge coupled devices (CCDs), and time delay integration (TDI) cameras. The detectors may also include any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the output acquisition system may be signals or data, but not image signals or image data. In such instances, a computer subsystem such as computer subsystem 36 of the system may be configured to generate images of the specimen from the non-imaging output of the detectors. However, in other instances, the detectors may be configured as imaging detectors that are configured to generate imaging signals or image data. Therefore, the system may be configured to generate the output described herein in a number of ways.

It is noted that FIG. 1 is provided herein to generally illustrate a configuration of an output acquisition subsystem that may be included in the system embodiments described herein. Obviously, the output acquisition subsystem configuration described herein may be altered to optimize the performance of the system as is normally performed when designing a commercial inspection, defect review, or other system. In addition, the systems described herein may be implemented using an existing output acquisition system (e.g., by adding functionality described herein to an existing output acquisition system) such as optical inspection and/or defect review tools such as the 28xx and 29xx series of tools that are commercially available from KLA-Tencor and other tools that are commercially available from other sources. For some such systems, the methods described herein may be provided as optional functionality of the system (e.g., in addition to other functionality of the system). Alternatively, the system described herein may be designed "from scratch" to provide a completely new system.

Computer subsystem 36 of the system may be coupled to the detectors of the output acquisition subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Although the output acquisition subsystem is described above as being an optical or light-based output acquisition subsystem, the output acquisition subsystem may be an electron beam-based output acquisition subsystem. For example, in one embodiment, the energy directed to the specimen includes electrons, and the energy detected from the specimen includes electrons. In this manner, the energy source may be an electron beam source. In one such embodiment shown in FIG. 2, the output acquisition subsystem includes electron column 122, which is coupled to computer subsystem 124.

Figure 2:
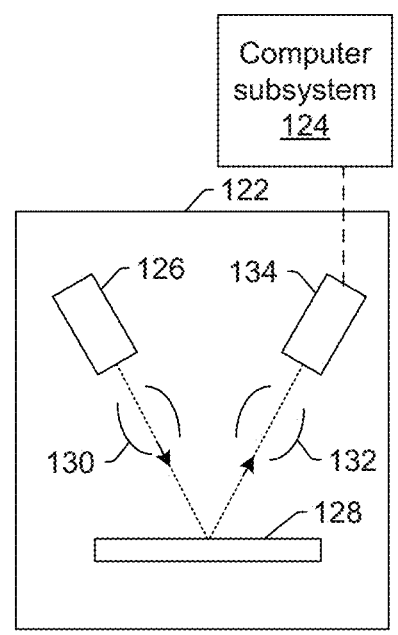

As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam-based subsystem may be configured to use multiple modes to generate images of the specimen (e.g., with different illumination angles, collection angles, etc.). The multiple modes of the electron beam-based subsystem may be different in any image generation parameters of the subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the output acquisition subsystem shown in FIG. 2 may be further configured as described herein.

It is noted that FIG. 2 is provided herein to generally illustrate a configuration of an electron beam-based output acquisition subsystem that may be included in the embodiments described herein. As with the optical output acquisition subsystem described above, the electron beam-based output acquisition subsystem configuration described herein may be altered to optimize the performance of the output acquisition subsystem as is normally performed when designing a commercial inspection or defect review system. In addition, the systems described herein may be implemented using an existing defect review system (e.g., by adding functionality described herein to an existing inspection or defect review system) such as the eDR-xxxx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Although the output acquisition subsystem is described above as being a light-based or electron beam-based output acquisition subsystem, the output acquisition subsystem may be an ion beam-based output acquisition subsystem. Such an output acquisition subsystem may be configured as shown in FIG. 2 except that the electron beam source may be replaced with any suitable ion beam source known in the art. In addition, the output acquisition subsystem may be any other suitable ion beam-based subsystem such as those included in commercially available focused ion beam (FIB) systems, helium ion microscopy (HIM) systems, and secondary ion mass spectroscopy (SIMS) systems.

As noted above, the output acquisition subsystem is configured for scanning energy (e.g., light or electrons) over a physical version of the specimen thereby generating actual output (e,g., images) for the physical version of the specimen. In this manner, the output acquisition subsystem may be configured as an "actual" tool, rather than a "virtual" tool. For example, a storage medium (not shown) and computer subsystem(s) 102 shown in Fig, 1 may be configured as a "virtual" tool. In particular, the storage medium and the computer subsystem(s) are not part of output acquisition subsystem 10 and do not have any capability for handling the physical version of the specimen. In other words, in tools configured as virtual tools, the output of its one or more "detectors" may be output that was previously generated by one or more detectors of an actual tool and that is stored in the virtual tool, and during the "scanning," the virtual tool may replay the stored output as though the specimen is being scanned. In this manner, scanning the specimen with a virtual tool may appear to be the same as though a physical specimen is being scanned with an actual tool, while, in reality, the "scanning" involves simply replaying output for the specimen in the same manner as the specimen may be scanned. Systems and methods configured as "virtual" inspection tools are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents. In addition, configuring the one or more virtual systems as a central compute and storage (CCS) system may be performed as described in the above-referenced patent to Duffy. The persistent storage mechanisms described herein can have distributed computing and storage such as the CCS architecture, but the embodiments described herein are not limited to that architecture.

The output acquisition subsystem included in the embodiments described herein may be configured to generate output (e.g., images) of the specimen with multiple modes. In general, a "mode" can be defined by the values of parameters of the output acquisition subsystem used for generating output for (e.g., images of) a specimen. Therefore, modes that are different may be different in the values for at least one of the parameters of the output acquisition subsystem. For example, in one embodiment of an optical based output acquisition subsystem, at least one of the multiple modes uses at least one wavelength of light for illumination that is different from at least one wavelength of the light for illumination used for at least one other of the multiple modes. The modes may be different in the illumination wavelength as described further herein (e.g., by using different light sources, different spectral filters, etc.) for different modes. In another embodiment, at least one of the multiple modes uses an illumination channel of the output acquisition subsystem that is different from an illumination channel of the output acquisition subsystem used for at least one other of the multiple modes. For example, as noted above, the output acquisition subsystem may include more than one illumination channel. As such, different illumination channels may be used for different modes.

In one embodiment, the output acquisition subsystem is configured as an inspection subsystem. For example, the optical and electron beam output acquisition subsystems described herein may be configured as inspection tools. In another embodiment, the output acquisition subsystem is configured as a metrology subsystem For example, the optical and electron beam output acquisition subsystems described herein may be configured as metrology tools. In a further embodiment, the output acquisition subsystem is configured as a defect review tool. For example, the optical and electron beam output acquisition subsystems described herein may be configured for defect review applications. In particular, the embodiments of the output acquisition subsystems described herein and shown in FIGS. 1 and 2 may be modified in one or more parameters to provide different capability depending on the application for which they will be used. In one such example, the output acquisition subsystem shown in FIG. 1 may be configured to have a higher resolution if it is to be used for metrology rather than for inspection. In other words, the embodiments of the output acquisition subsystem shown in FIGS. 1 and 2 describe some general and various configurations for an output acquisition subsystem that can be tailored in a number of manners that will be obvious to one skilled in the art to produce output acquisition subsystems having different capabilities that are more or less suitable for different applications.

The one or more computer subsystems described above are configured for detecting defects on the specimen based on the output generated by the detector to thereby generate a set of detected defects. The computer subsystem(s) described herein may be configured to detect the defects on the specimen in any suitable manner (e.g., by applying a threshold to the output and identifying output having one or more values above the threshold as a detect or potential detect and not identifying output having one or more values below the threshold as a defect or potential defect). The defects detected on the specimen may include any defects known in the art. In this manner, the computer subsystem(s) described herein may generate a set of the detected defects.

The results produced by the one or more computer subsystems for the set of the detected defects may include information for defects detected on the specimen by an inspection process and/or possibly a defect review process. The information may include information for one or more attributes of the defects. The one or more defect attributes may include any defect attributes that can be determined by an inspection or defect review system or from results generated by an inspection or defect review system. Examples of suitable defect attributes that can be included in defect detection results include, but are not limited to, energy, magnitude, die coordinates, and design attributes. The defect detection results may include any other suitable information about the defects detected on the specimen such as the locations of the defects detected on the specimen and image data or images generated for the defects.

The one or more computer subsystems are further configured for, for the defects detected in an array region on the specimen, where the array region includes multiple array cell types, stacking information for the defects based on the multiple array cell types. The stacking includes overlaying design information for only a first of the multiple array cell types with the information for only the defects detected in the first of the multiple array cell types. The information for only the defects detected in the first of the multiple array cell types includes positions of the defects within the first of the multiple array cell types. In this manner, the embodiments described herein identify and stack defects based on array cell types.

Figure 3:
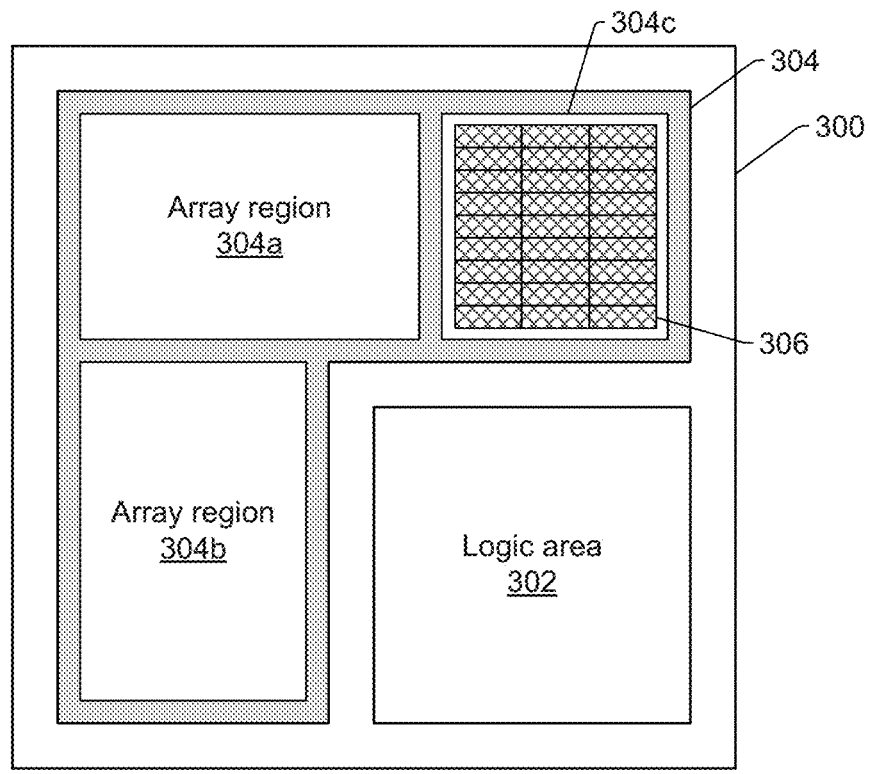
FIG. 3 is a schematic diagram illustrating a plan view of one example of the layout of array regions and a logic area in a design for a device being formed with a specimen.

A very generic example of a die or chip layout is shown in FIG. 3 to illustrate and promote understanding of some of the terms used herein. It is noted that nothing shown in FIG. 3 is meant to represent any particular design of any particular device and/or chip and any patterned features that may be included therein. In this example, die 300 includes logic area 302 and array area 304. (The die may include other, additional areas and regions that are not shown in FIG. 3 for the sake of simplicity.) Logic area 302 may include patterned features that vary greatly in characteristics such as size, spacing (or period), orientation, and shape and do not necessarily repeat at a relatively high frequency. In contrast, array areas generally include patterned features that are designed to be the same and repeat at a relatively high frequency.

The smallest re-usable unit in a layout is called a "cell." A typical design has multiple types of array cells, and each of them may include different types of bit cells. For example, as shown in FIG. 3, array area 304 may include different array regions that in this example include array regions 304a, 304b, and 304c. Each of the array regions may include different types of bit cells. In one such example, as shown in array region 304c, bit cells 306 may be formed therein. Array regions 304a and 304b may also include bit cells (not shown in FIG. 3). Each of the bit cells in an array region may have the same design. In other words, the layout and characteristics of the patterned features in each of the bit cells in any one of the array regions may be designed to be the same. If array regions 304a, 304b, and 304c include different types of bit cells, then the bit cells in array region 304a may be different than the bit cells in array regions 304b and 304c. In addition, the bit cells in array region 304b may be different than the bit cells in array regions 304a and 304c, and the bit cells in array region 304c may be different than the bit cells in array regions 304a and 304b.

In this manner, array regions 304a, 304b, and 304c may be different types of array regions that have different purposes. In one such example, the different array regions may be part of different memory devices being formed in the die. In particular, array region 304*a* may be part of a first type of memory device being formed in the die, array region 304*b* may be part of a second type of memory device being formed in the die, and array region 304*c* may be part of a third type of memory device being formed in the die. The first, second, and third types of the memory devices may all be different from each other. In another example, the different array regions may be part of different memory devices that are of the same type but have different characteristics from one another. For example, two of the array regions may be static random access memory (SRAM) devices having different characteristics from each other.

The list of array cell types included in a device is available inside the reticle design file. However, today, systems and methods do not use this array cell or bit cell location information for sampling. For example, cell name and location information is not utilized today in any advanced inspection tool features. The embodiments described herein however exploit this information from array context for this feature.

In some embodiments, the stacking step includes overlaying design information for one or more other of the multiple array cell types with the information for only the defects detected in the one or more other of the multiple array cell types, respectively. For example, although some embodiments are described herein with respect to only one (or a first) of the multiple cell types, the embodiments described herein can perform the stacking as described herein separately for one or more of the multiple cell types. In this manner, the stacking may include overlaying design information for a first of the multiple array cell types with the information for only the defects detected in the first of the multiple array cell types, overlaying design information for a second of the multiple array cell types with the information for only the defects detected in the second of the multiple array cell types, overlaying design information for a third of the multiple array cell types with the information for only the defects detected in the third of the multiple array cell types, and so on. In this manner, stacking does not have to be limited to only a first of the multiple cell types. Instead, the stacking can be performed as described herein for all of the cell types.

Figure 5:
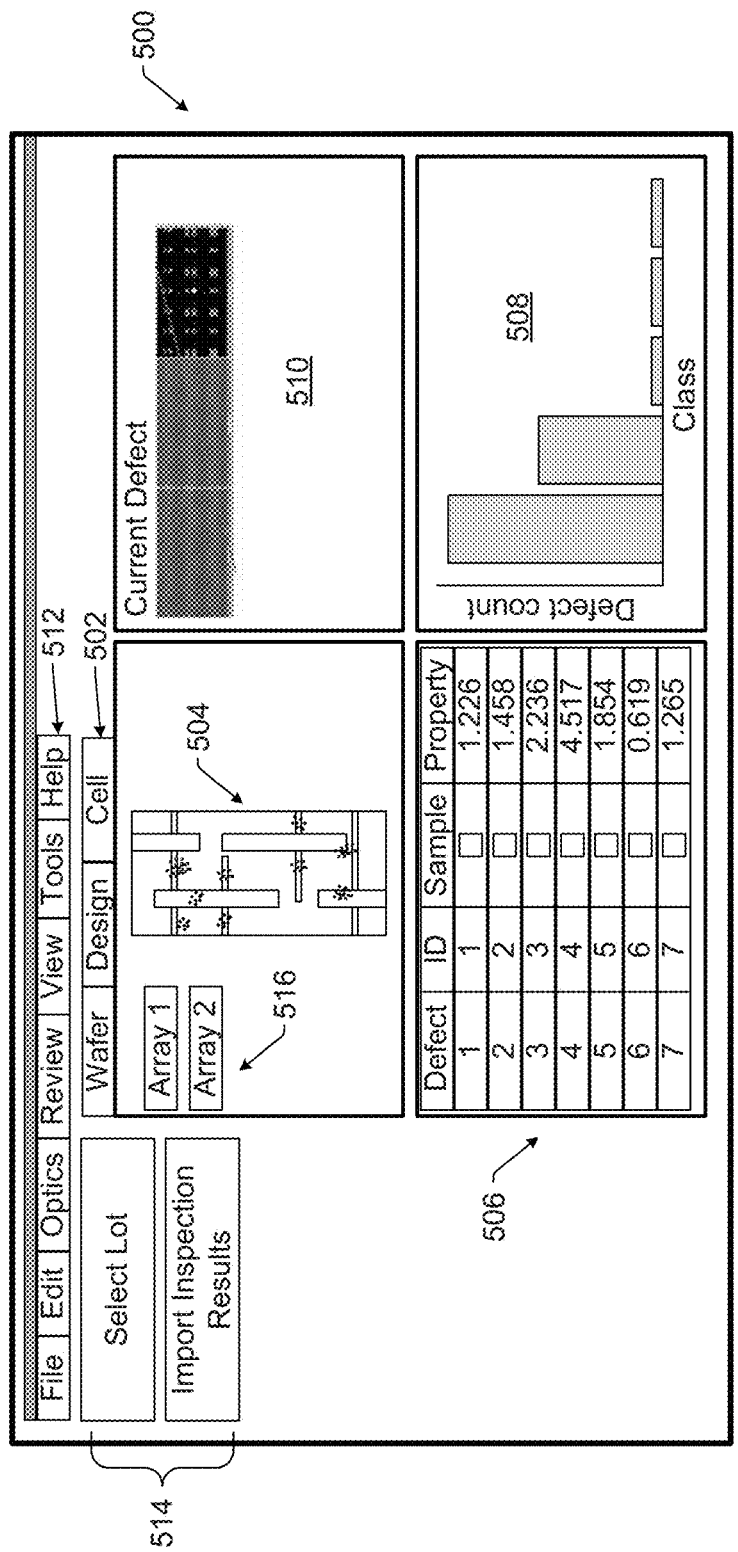
FIG. 5 is a schematic diagram illustrating one embodiment of a screenshot that may be displayed by an embodiment of a user interface configured as described herein.

In addition, as described further herein, e.g., in the user interface shown in FIG. 5, if the stacking is performed for more than one of the cell types, the user interface can be configured to allow a user to pick one of the cell types to view/perform one or more sampling operations using defect stacking information. If the stacking is performed for more than one cell type, therefore, the stacking results can be displayed separately or collectively for a user, the user can choose which stacking results are displayed, and the sampling can be separately performed for each of the multiple cell types as described further herein (e.g., with different biasing parameters for different cell types).

More specifically, in the stacking step described above, which is preferably performed separately for array cell types that are different from one another and therefore may have different bit cells formed therein, the positions of the defects in the array or bit cell of the array cell type for which the stacking is being performed may be used to combine or stack all of the defects detected within multiple instances of the array or bit cells in that array cell type into a single instance of the array cell type. The information for each of those defects (e.g., the within cell positions) may then be overlaid with the design information for that single instance of the array cell type to thereby illustrate the positions of each of the defects within each of the cells with respect to the patterned features in one of the cells (i.e., the design data for the cells). Therefore, the stacking results may illustrate correlations of the defect positions within the cells to the positions of patterned features within the cells. The stacking results can therefore be used to determine additional information about the defects such as which defects repeat at any given location within a cell, the frequency with which the defects repeat at any given location within a cell, the density of defects within an area within the cell, and which patterned features or areas within the cell are more prone to defects than other patterned features or areas. As described further herein, this information can be used by the embodiments described herein and/or conveyed to a user so that they can bias a detect sample created from the detected defects in a variety of different manners.

Figure 4:
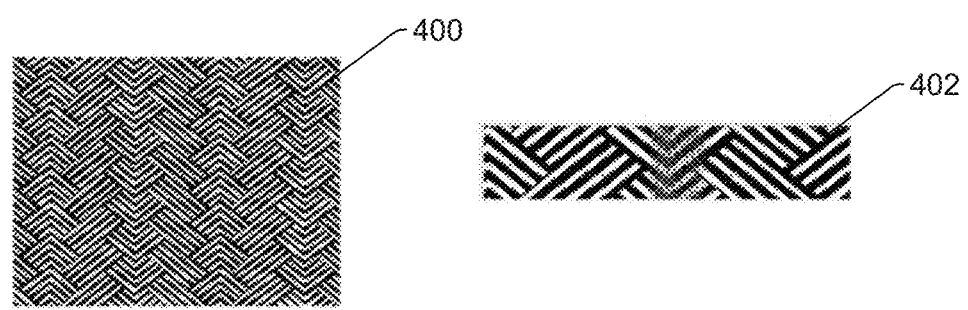
FIG. 4 is a schematic diagram illustrating a plan view of one example of an array cell type and results of stacking performed as described herein for the array cell type.

In one particular example, as shown in FIG. 4, array region 400 may include a number of different instances of the same cell type that repeat over and over again within the array region. The defects detected in all of the same type of cells may be overlaid on the design information for a single instance of the cell type. For example, as shown in array region 400, the portion of this array region shown in FIG. 4 includes a number of instances of the same type of cell that repeat in both in x and y. The within cell positions of the defects detected in all of the cell instances of the same type and the design data for the cell type may then be used to generate a representation of only one instance of the cell type with indicators of the positions of each of the defects detected in all of the cell instances. In this manner, the defect inspection results for all (or at least some) instances of the same type of cell can be "stacked" into one single instance of the cell and overlaid on a graphical representation of that cell type. For example, as shown in stacking results 402, one instance of the cell is shown with all of the defect positions detected in all instances of the same cell type shown overlaid therein. In this manner, the sampling can be performed as described further herein using the cell stacking results of the embodiments described herein.

Sampling from array regions today is performed manually and is very tedious despite the availability of features such as iDO, which is commercially available from KLA-Tencor, and nuisance event filters (NEF). The time to sample today is anywhere between 3 hours to 5 hours and could involve multiple instances of sampling. However, the embodiments described herein, which are based on cell stacking in array regions, are expected to improve sampling performance in a semi-automated fashion (with all defect of interest (DOI) types sampled) within one iteration performed in less than one hour.

In one embodiment, the information for only the defects detected in the first of the multiple array cell types includes the information for only the defects detected in more than one instance of the first of the multiple array cell types in the array region on the specimen. For example, as described further herein, one array area on a die or chip may include multiple array regions, and any one array region in the array area may include multiple instances of a single array cell type. In particular, as shown in FIG. 3, array area 304 includes array regions 304*a,* 304*b,* and 304*c,* and array region 304*c* may include multiple instances of bit cells 306, each of which may be the same type. Therefore, the defect information that is used in the stacking step for that array region may include the defect information for defects detected in at least two instances of the single cell type, which may include all of the instances of the single cell type or at least some of the instances of the single cell type (i.e., fewer than of the instances of the single cell type).

In another embodiment, the array region for which the stacking is performed includes only one instance of the array region formed on the specimen. For example, on the specimens described herein such as wafers and reticles, multiple instances of the chip or die may be formed thereon. In this manner, multiple instances of each of the array area and array regions included in the chip or die may be formed on the wafer or reticle. In one such example, die 300 shown in FIG. 3 may be formed on a wafer or reticle multiple times in different areas of the wafer or reticle. Therefore, multiple instances of the array area and each of the array regions formed therein will be formed on the specimen. In the embodiment described above, however, the stacking may be performed in only one of those multiple instances on the specimen. In particular, the stacking may be performed for only array region 304*c* in only one instance of die 300 formed on a specimen. However, the stacking may also be separately performed for any other array region in any one other instance of die 300 formed on the specimen. In one such example, the stacking may be performed for only array region 304*c* in one instance of die 300 formed on a specimen, and the stacking may also be separately performed for only array region 304*c* in a different instance of the die formed on the specimen. In this manner, the stacking may be separately performed for the same type of array region and therefore array cell type formed in different dies on a specimen. In another such example, the stacking may be performed for only array region 304*c* in one instance of die 300 formed on the specimen, and the stacking may also be separately performed for only array region 304*b* in the same instance of the die 300 formed on the specimen. In this example, the stacking may not be performed for any other dies formed on the specimen.

In an additional embodiment, the information for only the defects detected in the first of the multiple array cell types includes the information for only the defects detected in more than one instance of the first of the multiple array cell types in more than one instance of the array region on the specimen. For example, as described above, on the specimens described herein such as wafers and reticles, multiple instances of the chip or die may be formed thereon. In this manner, multiple instances of each of the array area and array regions included in the chip or die may be formed on the wafer or reticle. In one such example, die 300 shown in FIG. 3 may be formed on a wafer or reticle multiple times in different areas of the wafer or reticle. Therefore, multiple instances of the array area and each of the array regions formed therein will be formed on the specimen.

Unlike the embodiment described above, however, in this embodiment, the stacking may be performed for more than one of those multiple instances on the specimen. In particular, the stacking may be performed for only array region 304*a* in more than one instance of die 300 formed on a specimen. However, the stacking may also be separately performed for any other array region in more than one instance of die 300 formed on the specimen. In one such example, the stacking may be performed for only array region 304*c* in more than one instance of die 300 formed on a specimen. In this manner, the stacking may be collectively performed for the same type of array region and therefore array cell type formed in different dies on a specimen. In another such example, the stacking may be performed for only array region 304*c* in more than one instance of die 300 formed on the specimen, and the stacking may also be separately performed for only array region 304*b* in the more than one instance of die 300 formed on the specimen.

Whether or not the stacking is performed for a single instance of an array region in a single instance of an array area in a single instance of a die on a specimen or more than one instance of an array region and/or more than one instance of the array area in more than one instance of a die on the specimen may be determined in a number of different manners. For example, the parameters of the stacking may be determined based on characteristics of the specimen. In one such example, if certain areas of a specimen such as a wafer are known to have significantly different noise characteristics than other areas of the wafer, then the stacking may be performed separately for the areas having different noise characteristics and/or may not be performed for all of the areas (e.g., not in particularly noisy areas of the wafer). In another example, the parameters of the stacking may be determined based on the defect detection results. In one such example, the number of instances of any one array cell type whose defect information is used for any one stacking step may be determined based on how many instances of the array cell type are needed to provide statistically meaningful stacking results (e.g., if fewer defects are detected per array cell type, then the defect information for more of the array cell type instances may be stacked to provide meaningful results). In an additional example, the parameters of the stacking step may be selected by a user. In one such example, the embodiments described herein may provide to a user (e.g., via one of the user interface embodiments described further herein) options for parameters of the stacking. The user may then select the parameters such as how many and/or which instances of the array area or region and/or which array cell type are used for the stacking step based on the information that they are interested in. In one particular such example, the user may only be interested in stacking the defect information for instances of only one particular array cell type located in a certain area on the specimen (e.g., instances formed only near the edges of the specimen). The embodiments described herein provide, therefore, significant flexibility in how the stacking step is performed.

In some embodiments, the array region includes a static random access memory (SRAM) array region of a device being formed with the specimen. For example, the embodiments described herein can be used for sampling relevant SRAM defect types using design intent. However, the embodiments described herein can be used for sampling defects from any type of memory area formed on a specimen. In addition, the array region may include any SRAM array region known in the art. In other words, the embodiments described herein are not believed to be limited in the types of array regions for which the stacking and sampling can be performed.

In one embodiment, the design information overlaid with the information for only the defects detected in the first of the multiple array cell types in the stacking includes a graphical representation of the patterned features in the first of the multiple array cell types. For example, as shown in FIG. 4, the information for the defects in the array cell type for which the stacking step is being performed may be overlaid with a two-dimensional graphical representation of the patterned features in the array cell type. The graphical representation may be generated from the design data and may simply be a two-dimensional representation of polygons representing the patterned features as they are defined in the design. The graphical representation may also be generated from the design data by simulating how the patterned features in the array cell type for which the stacking step is being performed will appear in images of the specimen generated by the output acquisition subsystem and/or computer subsystem(s). For example, the simulation may take as input the design data and may simulate the fabrication steps that are used to form the patterned features on the specimen and the output acquisition performed to generate an image of the patterned features. The graphical representation may also be an image generated of the specimen by the output acquisition subsystem and/or computer subsystem(s) described herein. In another example, the graphical representation may be a high resolution image of the patterned features as they are formed on the specimen or as they are defined in the design data generated from a lower resolution image of the specimen. In particular, a higher resolution image of the specimen or design data for the specimen may be generated from a lower resolution image of the specimen using a deep learning model as described in, for example, U.S. Patent Application Publication No. 2017/0193680 by Zhang et al. published on Jul. 6, 2017 and 2017/0200265 by Bhaskar et al. published on Jul. 13, 2017, which is incorporated by reference as if fully set forth herein. The embodiments described herein may be further configured as described in this publication. In any case, by illustrating the patterned features with the defects overlaid thereon, the spatial relationships between the patterned features and the defects may be easily understood by a user.

In another embodiment, the design information for only the first of the multiple array cell types is generated from design data for the specimen. For example, the first (and other) array cell types for which the stacking step is performed as described herein do not need to be generated by a user or based on input from a user. Instead, when the design data is available for the inspection and/or array region defect sampling, an instruction in the recipe used to perform the steps described herein may cause the one or more computer subsystems to access the design data and generate the design information for the first (and possibly other) array cell types from the design data without any input from a user. For example, in an additional embodiment, the one or more computer subsystems are configured for identifying the multiple array cell types based on design data for the specimen and without input from a user. In this manner, the design information for the first (and possibly other) array cell types may be generated automatically without input from a user and the array cell types may be identified automatically by the computer subsystem(s) described herein without input from a user. The multiple array cell types described herein are therefore different from user-defined care areas (i.e., areas in which certain steps are to be performed in an inspection-related process) because the embodiments described herein do not require a user to manually set up the multiple array cell types by identifying them and/or generating or selecting the design information for the multiple array cell types.

In some embodiments, the system includes a user interface configured for displaying the results of the stacking and options for biasing the sample for the multiple array cell types to a user and receiving the options selected for the biasing from the user, and the one or more computer subsystems are configured for selecting the portion of the detected defects based on the received options. Instead of displaying the entire design file and overlay of defects in the review mode in wafer inspector software, the user interface may only provide results of the stacking, which may include a variety of information as described further herein, and available options for the biasing. In this manner, the user interface may provide a "cell view." To enable this, the SRAM outline layer (e.g., a bounding box around all the SRAM blocks present within a die) or other type of array region outline layer may be identified as part of the RDF or other design information described herein.

The user interface may be provided by and/or generated using information from the one or more computer subsystems. For example, user interface 102 may be coupled to computer subsystem(s) 104 as shown in FIG. 1 such that the user interface is generated by and/or uses information provided by the computer subsystem(s). The user interface may also be part of the computer subsystem(s) and may include any suitable hardware and/or software components known in the art. User interface 104 may be further configured as described with respect to FIG. 5.

In one embodiment of the user interface described above, as shown in FIG. 5, user interface 500 may include a number of options for how the results of the inspection are displayed, which may include wafer, design, and cell, as shown in display options tabs 502. (Although the user interface is shown in FIG. 5 and described herein with respect to a wafer, the user interface may also be used for any other specimen described herein.) When the cell view is selected, the results of the cell stacking are shown in user interface. On selecting the cell view, the user interface may display the stacked view of all (or one or more) array cell types and defects overlaid on top of them. For example, cell stacking results may be shown as overlay 504, which includes a graphical representation of the design data for a cell type with defect positions shown thereon. The positions of the defects within the different array cell types may be determined based on the positions reported by the inspection tool and may be identified as defect attributes including x and y cell positions (e.g., "Cell_X" and "Cell_Y"). In some instances, the defect positions may not be reported by the inspection tool or recipe as within array cell positions. In such instances, the embodiments described herein may translate the reported defect coordinates to within cell coordinates. The graphical representation of the design data may include a two-dimensional drawing representing the locations, dimensions, and other characteristics of the polygons in the design data for the cell for which the cell stacking results are being displayed. However, the graphical representation of the design data shown in the user interface may be any other suitable representation of the design data such as an image of a reticle on which the design data was printed, an image of a wafer on which the design data was printed, a simulated image of how the design data is expected to be printed on the wafer, and others described further herein. In general, the design data may be displayed graphically in the cell stacking results in any manner that will convey the spatial relationship between the detected defect positions and the positions of the patterned features in the design data. The defects may be indicated in the overlay results by points as shown in FIG. 5, hut they may be illustrated graphically at their within cell positions in any other suitable manner in the user interface embodiments described herein.

The user interface may also include a variety of other information displayed for a user. In one instance, the information may include table 506, which may include information determined for individual defects detected in the cell. Depending on which view is selected (e.g., wafer, design, cell), the defects whose information is included in the table may change. For example, when the cell view is selected, the table may include information for only defects in the particular cell type(s) for which information is being displayed. The table may include any information determined for the individual defects by wafer inspection and/or other defect-related process. In some instances, the table may include a defect ID, as shown in the ID column of table 506, an indication of whether or not each of the individual defects have been sampled (e.g., the boxes in the Sample column may be checked for defects that have been selected to be in a sample and unchecked for defects that have not been selected to be in the sample), and a property determined for the defects as shown in Property column of table. The property column shown in FIG. 5 may be only one of multiple columns (not shown) of defect properties that are included in the table, and one column may be included in the table for each of the properties. The properties that are displayed in the table may include any defect properties determined by inspection such as energy, magnitude, size, position, region, etc. and/or any other defect properties determined by any other defect-related process.

In another example, the information may include bar chart 508, which may include information for the defects detected in the cell. The information for the defects included in the bar chart may also change as described above based on which view (wafer, design, cell) is selected. The bar chart may be generated for different defect classes along the x axis. The y axis of the bar chart may show the number of defects included in each defect class included in the bar chart. Other bar charts may also be generated and shown in the user interface. These may include defect counts per different ranges of values for a defect property, defect counts per different positions (or area) within a cell, etc. The user interface may include a number of options (not shown) that a user can select to thereby cause the user interface to display different types of bar charts.

In a further example, the information may include a number of different images shown in window 510. The different images may be displayed for one particular defect selected by the user, which may be selected by clicking on a particular defect (the "current defect") in the stacking results. The different images may include, for example, a defect image, a reference image, and a difference image, which may be generated by subtracting the reference image from the defect image. The different images may be generated by the output acquisition subsystem and/or computer subsystem(s) described herein. For example, the defect, reference, and difference images may be generated for a defect during inspection and/or review. In general, for any of the different types of information that are displayed in the user interface, the user interface may allow operations like selecting a group of defects, a current defect, etc. so that the display of the information can be customized and changed depending on the desires and needs of the user.

The user interface may include any other options and information that are included in inspection, review, metrology, etc. tool software and/or that are generated by specimen inspection, review, or metrology. For example, the user interface may include row 512 of tabs, each of which when selected display a drop down menu containing various options. As shown in FIG. 5, the row of tabs may include File, Edit, Optics, Review, View, Tools, and Help tabs. The drop down menus that are displayed upon selection of any of these tabs may include any suitable options known in the art. The user interface may also include a number of buttons 514 for options regarding the inspection, review, or metrology results that are displayed. The options may include a Select Lot option for selecting which "lot" of inspection, review, or metrology results are displayed in the user interface. The options may also include an Import Inspection Results option for importing inspection results from another source.

In one such embodiment, the results of the stacking include results of the stacking performed separately for the first and at least one other of the multiple array cell types and densities of the detected defects in the multiple array cell types, and the options displayed by the user interface for the biasing include options for biasing the sample based on the densities of the detected defects. In this manner, the embodiments described herein allow a user to examine defect densities on each array region and bias sampling based on defect density distribution for defect sampling. For example, the embodiments described herein may utilize a new sampling user interface that will accept biasing parameters based on the defect densities in the array cell types.

In another such embodiment, the results of the stacking include results of the stacking performed separately for the first and at least one other of the multiple array cell types, and the options displayed by the user interface for the biasing include options for biasing the sample based on the multiple array cell types. In this manner, the embodiments described herein provide a new defect sampling methodology and user interface to allow biasing to array cell type. The embodiments described herein can therefore ensure that defects are not oversampled from a particular array region and enable biasing the sample based on array cell type. For example, the embodiments described herein may utilize a new sampling user interface such as that shown in FIG. 5 that will accept biasing parameters based on the array cell type. The embodiments described herein allow the user to tweak these inputs and define a sampling scheme for different array types. This will ensure that the user is now aware of the array context and can sample based on not just defects landing on array region, but also bias based on array cell types. In addition, the embodiments described herein may enable biasing based on both array cell type and their corresponding defect densities.

The embodiments described herein may also provide options for the user to use cell based parameters such as cell x position and cell y position as part of the attributes used for sampling. With the cell view, the user interface may also support displaying a heat map to thereby help the user differentiate where the defectivity is high in the cell stack. Operations such as filtering can be supported in cell view to assist the user in sampling. It may also be possible to have different color codes corresponding to DOI and nuisance class codes and have it displayed within the cell view.

In a further such embodiment, the results of the stacking include results of the stacking performed separately for the first and at least one other of the multiple array cell types, and the user interface is configured for displaying additional options for the user to select which of the results of the stacking performed separately are displayed in the user interface. For example, different cell stacking results may be displayed at different times or the same time. In other words, although stacking results for only one cell type are shown in the user interface of FIG. 5, the user interface is preferably configured to make it possible to have different stacking results displayed simultaneously or upon user request by providing the user with flexibility in what is displayed in the user interface. In one such example, as shown in FIG. 5, user interface may include options 516, which may include one option for each of the different cell types identified in the design for the specimen. In the example shown in FIG. 5, the different cell type options include a first array cell type ("Array 1") and a second array cell type ("Array 2"), but any number of different array cell types may be displayed in the user interface with any suitable identification. In a particular example, the first array cell type may be a first SRAM cell type (e.g., "SRAM 1" or a first SRAM block), and the second array cell type may be a second SRAM cell type (e.g., "SRAM 2" or a second SRAM block).

The one or more computer subsystems are further configured for selecting a portion of the detected defects based on results of the stacking thereby creating a sample of the detected defects. Selecting the portion of the detected defects may be performed based on the biasing parameters received from a user via the user interface. The biasing parameters may include any combination of biasing parameters described herein. The selecting may also be performed based on any other input received from the user and/or via instructions included in a recipe for the sampling. For example, the selecting may be performed based on a predetermined number of defects to be sampled, which may be selected based on the biasing parameters received from the user. The selecting may alternatively be performed based on a predetermined percentage of the total number of defects detected in the array cell type. The detected defects that are selected will be fewer than all of the detected defects because the purpose of the sampling described herein is to generate a smaller population of the detected defects to be used for other step(s) such as defect review, metrology, etc.

The one or more computer subsystems are also configured for generating defect sample results based on the selected portion of the detected defects and the information for the selected portion of the detected defects. Generating the defect sample results may include gathering the information generated by defect detection for the selected defects and combining that gathered information into a results file that is different than the inspection results file. The defect sampling results file may have any suitable format that may be used for other step(s) such as those described above, e.g., inspection, review, metrology, etc. Generating the defect sample results may however include modifying, altering, or annotating the inspection results file with the defect sample information. For example, the inspection results file may include a list of defects detected on the specimen, which may include information in a table such as table 506 that is shown in FIG. 5. If the inspection results file includes a column for indicating whether each (or one or more) of the detected defects is selected to be in a sample, the information in that column may be altered based on the results of the selecting step described herein. In another example, the inspection results file may be modified to include such information and/or the information for the selected portion of the defects may simply be annotated to the inspection results file.

The embodiments described herein do not necessarily create sub-samples, one for each array cell type or bit cell type, but allow sampling of defects by visualizing and analyzing the defectivity within cell stack. A user may determine to bias the sampling towards specific bit cell(s) or array cell(s) based on the defectivity but without implementing the ideas described herein it is not intuitive.

The idea of die stack and reticle stack have existed for a long time as they help with identifying signatures and problematic areas within the die or reticle, but given the size of a repeating cell block, which is sub-micron usually, the idea of cell stack and more importantly applications of having cell stack view are non-obvious. KLA-Tencor has developed proprietary features that have been highly successful in providing improved sensitivity for NMOS/PMOS regions. As we further develop features to address within PMOS/NMOS region DOI/nuisance separation, the need for improved sampling from within cell regions arose. The ideas described herein are new and quite different from any of the existing sampling schemes and methods that are primarily focused on sampling per region, care area group, etc.

If there are enough repeating structures available in design, there is a possibility of extending cell based sampling regions as well. In particular, if there are enough repeating structures available in a logic area of the device being formed on the specimen, then the steps described herein may be performed for the logic area. For example, in one embodiment, the one or more computer subsystems are configured for, for the defects detected in a logic region on the specimen, the logic region includes multiple repeating structure types, further stacking information for the defects based on the multiple repeating structure types. This stacking includes overlaying design information for only a first of the multiple repeating structure types with the information for only the defects detected in the first of the multiple repeating structure types, and the information for only the defects detected in the first of the multiple repeating structure types includes positions of the defects within the first of the multiple repeating structure types. One such embodiment also includes selecting another portion of the detected defects based on results of this stacking and creating another sample of the detected defects that includes information for only the selected other portion of the detected defects.

The steps described herein for the repeating structure types may be performed in the same manner as described herein with respect to the array cell types. For example, the steps may be performed as described herein with the array cell types replaced with the repeating structure types found in the logic area. In addition, the steps may be separately performed for different repeating structure types found in the logic area. Furthermore, any of the other steps described herein may also be performed for the logic area. For example, the computer subsystem(s) may be configured for identifying the first (and possibly other) multiple repeating structure types in the logic area automatically without input from the user based on design data for the specimen.

The embodiments described herein provide a number of advantages over currently available methods and systems for generating defect samples for array regions. For example, if a user has to achieve sampling of defects based on array cell type today, they need to identify all SRAM types and keep them as different care area group codes. This set up requires changes based on SRAM definition in each design and is a very manual approach. In addition, the currently used methods and systems are not a robust methodology. In contrast, the embodiments described herein are advantageously generic. For example, the embodiments described herein can set themselves up automatically based on SRAM definitions inside design files.

Defect criticality on yield is location dependent and end users would like to know the accurate location where the defect occurs and also make use of this information. With design integration, advanced inspection tools have been able to report defect locations with greater accuracy, and features that provide enhanced sensitivity for detection and separation of PMOS/NMOS defects have been successful for improved sensitivity and nuisance reduction. Further development is geared toward providing within PMOS and NMOS separation of defects but there is no easy way to sample defects occurring at a specific portion within the SRAM cell. Ideas proposed herein enable the user to understand/visualize defectivity based on cell stack and with operations such as filtering it allows analyzing patching happening at specific locations within cell and help the user with improvised sampling. Once the sampled defects are reviewed and classified, it also allows the user to visualize the occurrence of DIO/nuisance within the cell stack to help determine the right care area strategy.

Each of the embodiments described herein may be further configured as described herein. For example, more than one of the embodiments described herein may be combined into one single embodiment.

Another embodiment relates to a computer-implemented method for creating a sample of defects detected on a specimen. The method includes steps for each of the functions of the computer subsystem(s) described above.

Each of the steps of the method may be performed as described further herein. The method may also include any other step(s) that can be performed by the output acquisition subsystem and/or computer subsystem(s) or system(s) described herein. The steps of the method are performed by one or more computer systems, which may be configured according to any of the embodiments described herein. In addition, the method described above may be performed by any of the system embodiments described herein.

Figure 6:
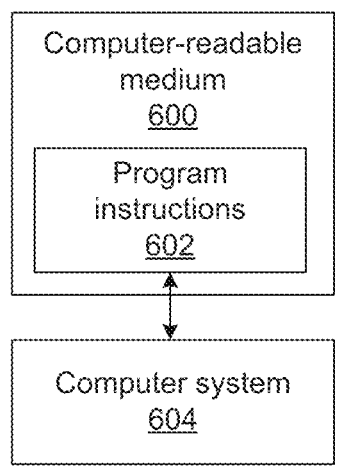
FIG. 6 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for creating a sample of defects detected on a specimen. One such embodiment is shown in FIG. 6. In particular, as shown in FIG. 6, non-transitory computer-readable medium 600 includes program instructions 602 executable on computer system 604. The computer-implemented method may include any step(s) of any method(s) described herein.

Program instructions 602 implementing methods such as those described herein may be stored on computer-readable medium 600. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, java-Beans, Microsoft Foundation Classes ("MFC"), (Streaming SIMD Extension) or other technologies or methodologies, as desired.

Computer system 604 may be configured according to any of the embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

In one example, the embodiments described herein may be configured to store or export the defect sampling results to another system or method such that additional process(es) can be performed for the defects included in the sample. These additional process(es) may include defect review, defect metrology, defect repair, and the like. In this manner, the defect sampling results may be stored and made available to and/or exported to a defect review system and/or method, a defect metrology system and/or method, a defect repair system and/or method, and the like. The defect sampling results may also be stored and used by the embodiments described herein and/or another method and/or system to alter the process performed on the specimen that resulted in the defects on the specimen. For example, the defects in the sample may be used to determine one or more changes to a lithography process or an etch process performed on the specimen prior to defect detection performed on the specimen. In this manner, the process can be preferably altered to reduce the number of defects detected on other specimens on which the process is performed.

Further modifications and alternative embodiments of various aspects of the invention will be apparent to those skilled in the art in view of this description. For example, methods and systems for creating a sample of defects detected on a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims,

What is claimed is:

1. A system configured to create a sample of defects detected on a specimen, comprising:
   an output acquisition subsystem comprising at least an energy source and a detector, wherein the energy source is configured to generate energy that is directed to a specimen, and wherein the detector is configured to detect energy from the specimen and to generate output responsive to the detected energy; and
   one or more computer subsystems configured for:
      detecting defects on the specimen based on the output generated by the detector to thereby generate a set of detected defects;
      for the defects detected in an array region on the specimen, wherein the array region includes multiple array cell types, stacking information for the defects based on the multiple array cell types, wherein the stacking comprises overlaying design information for only a first of the multiple array cell types with the information for only the defects detected in the first of the multiple array cell types, and wherein the information for only the defects detected in the first of the multiple array cell types comprises positions of the defects within the first of the multiple array cell types;
      selecting a portion of the detected defects based on results of the stacking thereby creating a sample of the detected defects; and
      generating defect sample results based on the selected portion of the detected defects and the information for the selected portion of the detected defects.

2. The system of claim 1, wherein the design information overlaid with the information for only the defects detected in the first of the multiple array cell types in the stacking comprises a graphical representation of the patterned features in the first of the multiple array cell types.

3. The system of claim 1, wherein the stacking further comprises overlaying design information for one or more other of the multiple array cell types with the information for only the defects detected in the one or more other of the multiple array cell types, respectively.

4. The system of claim 1, further comprising a user interface configured for displaying the results of the stacking and options for biasing the sample for the multiple array cell types to a user and receiving the options selected for the biasing from the user, wherein the one or more computer subsystems are further configured for selecting the portion of the detected defects based on the received options.

5. The system of claim 4, wherein the results of the stacking comprise results of the stacking performed separately for the first and at least one other of the multiple array cell types and densities of the detected defects in the multiple array cell types, and wherein the options displayed by the user interface for the biasing comprise options for biasing the sample based on the densities of the detected defects.

6. The system of claim 4, wherein the results of the stacking comprise results of the stacking performed separately for the first and at least one other of the multiple array cell types, and wherein the options displayed by the user interface for the biasing comprise options for biasing the sample based on the multiple array cell types.

7. The system of claim 4, wherein the results of the stacking comprise results of the stacking performed separately for the first and at least one other of the multiple array cell types, and wherein the user interface is further configured for displaying additional options for the user to select which of the results of the stacking performed separately are displayed in the user interface.

8. The system of claim 1, wherein the array region comprises a static random access memory array region of a device being formed with the specimen.

9. The system of claim 1, wherein the one or more computer subsystems are further configured for:
for the defects detected in a logic region on the specimen, wherein the logic region includes multiple repeating structure types, further stacking information for the defects based on the multiple repeating structure types, wherein the further stacking comprises overlaying design information for only a first of the multiple repeating structure types with the information for only the defects detected in the first of the multiple repeating structure types, and wherein the information for only the defects detected in the first of the multiple repeating structure types comprises positions of the defects within the first of the multiple repeating structure types;
selecting another portion of the detected defects based on result; of the further stacking; and
creating another sample of the detected defects comprising information for only the selected other portion of the detected defects.

10. The system of claim 1, wherein the design information for only the first of the multiple array cell types is generated from design data for the specimen.

11. The system of claim 1, wherein the one or more computer subsystems are further configured for identifying the multiple array cell types based on design data for the specimen and without input from a user.

12. The system of claim 1, wherein the information for only the defects detected in the first of the multiple array cell types comprises the information for only the defects detected in more than one instance of the first of the multiple array cell types in the array region on the specimen.

13. The system of claim 1, wherein the array region for which the stacking is performed comprises only one instance of the array region formed on the specimen.

14. The system of claim 1, wherein the information for only the defects detected in the first of the multiple array cell types comprises the information for only the defects detected in more than one instance of the first of the multiple array cell types in more than one instance of the array region on the specimen.

15. The system of claim 1, wherein the specimen comprises a waft.

16. The system of claim 1, wherein the output acquisition subsystem is further configured as an inspection subsystem.

17. The system of claim 1, wherein the energy directed to the specimen comprises light, and wherein the energy detected from the specimen comprises light.

18. The system of claim 1, wherein the energy directed to the specimen comprises light generated by a broadband plasma light source.

19. The system of claim 1, wherein the energy directed to the specimen comprises electrons, and wherein the energy detected from the specimen comprises electrons.

20. A non-transitory computer-readable medium, storing program instructions executable on a computer system for performing a computer-implemented method for creating a sample of defects detected on a specimen, wherein the computer-implemented method comprises:
detecting defects on a specimen based on output generated by a detector of an output acquisition subsystem, wherein the output acquisition subsystem comprises at least an energy source and the detector, wherein the energy source is configured to generate energy that is directed to the specimen, and wherein the detector is configured to detect energy from the specimen and to generate the output responsive to the detected energy;
for the defects detected in an array region on the specimen, wherein the array region includes multiple array cell types, stacking information for the defects based on the multiple array cell types, wherein the stacking comprises overlaying design information for only a first of the multiple array cell types with the information for only the defects detected in the first of the multiple array cell types, and wherein the information for only the defects detected in the first of the multiple array cell types comprises positions of the defects within the first of the multiple array cell types;
selecting a portion of the detected defects based on results of the stacking thereby creating a sample of the detected defects; and
generating defect sample results based on the selected portion of the detected defects and the information for the selected portion of the detected defects.

21. A computer-implemented method for creating a sample of defects detected on a specimen, comprising:
detecting defects on a specimen based on output generated by a detector of an output acquisition subsystem, wherein the output acquisition subsystem comprises at least an energy source and the detector, wherein the energy source is configured to generate energy that is directed to the specimen, and wherein the detector is configured to detect energy from the specimen and to generate the output responsive to the detected energy;
for the defects detected in an array region on the specimen, wherein the array region includes multiple array cell types, stacking information for the defects based on the multiple array cell types, wherein the stacking comprises overlaying design information for only a first of the multiple array cell types with the information for only the defects detected in the first of the multiple array cell types, and wherein the information for only the defects detected in the first of the multiple array cell types comprises positions of the defects within the first of the multiple array cell types;

selecting a portion of the detected defects based on results of the stacking thereby creating a sample of the detected defects; and generating defect sample results based on the selected portion of the detected defects and the information for the selected portion of the detected defects, wherein steps of the method are performed by one or more computer subsystems coupled to the output acquisition subsystem.

* * * * *